United States Patent [19]

Aubert et al.

[11] Patent Number: 4,623,423
[45] Date of Patent: Nov. 18, 1986

[54] PROCESS FOR PRODUCING A STRAIN-FREE MONOCRYSTAL OF A CRYSTALLINE FERROELECTRIC COMPOUND

[75] Inventors: Jean-Jacques Aubert, Saint Egreve; Bernard Bechevet, Claix; Jacques Daval, Meylan, all of France

[73] Assignee: Commissariat a l'Energie Atomique, Paris, France

[21] Appl. No.: 489,416

[22] Filed: Apr. 28, 1983

[30] Foreign Application Priority Data

May 4, 1982 [FR] France ................... 82 07727

[51] Int. Cl.$^4$ ............................................. C30B 1/02
[52] U.S. Cl. ............................ 156/603; 156/617 SP; 156/DIG. 71; 156/DIG. 73
[58] Field of Search ......... 156/617 SP, 617 V, 617 R, 156/DIG. 71, DIG. 73; 422/603, 249

[56] References Cited

U.S. PATENT DOCUMENTS 3,384,449  5/1968  Auloin et al. ................ 156/617 SP
3,488,157  1/1970  Koffer ......................... 156/617 SP

FOREIGN PATENT DOCUMENTS 179094  11/1982  Japan .
1149492  4/1969  United Kingdom .
1506799  4/1978  United Kingdom .

OTHER PUBLICATIONS

Ciszek, IBM Technical Disclosure Bulletin, vol. 17, No. 2, 7/74.
Chemical Abstracts, vol. 72, 1970, 25903w.
Caumo et al., Jl. of Crystal Growth, 33(1976), 8–10.
Schmidt et al., Nat. Res. Bull., vol. 6, No. 8, 771–74, 1971.

Primary Examiner—Hiram H. Bernstein
Attorney, Agent, or Firm—Michael N. Meller

[57] ABSTRACT

The process involves producing a monocrystal from the ferroelectric compound, annealing the monocrystal and cooling the latter in a zero longitudinal temperature gradient. The apparatus comprises means for producing the monocrystal and heating means for annealing the monocrystal in a zero temperature gradient, as well as for cooling the monocrystal in a zero longitudinal temperature gradient after annealing. The strain-free monocrystals may be used in the production of surface wave filters, modulators and optical amplifiers.

11 Claims, 7 Drawing Figures

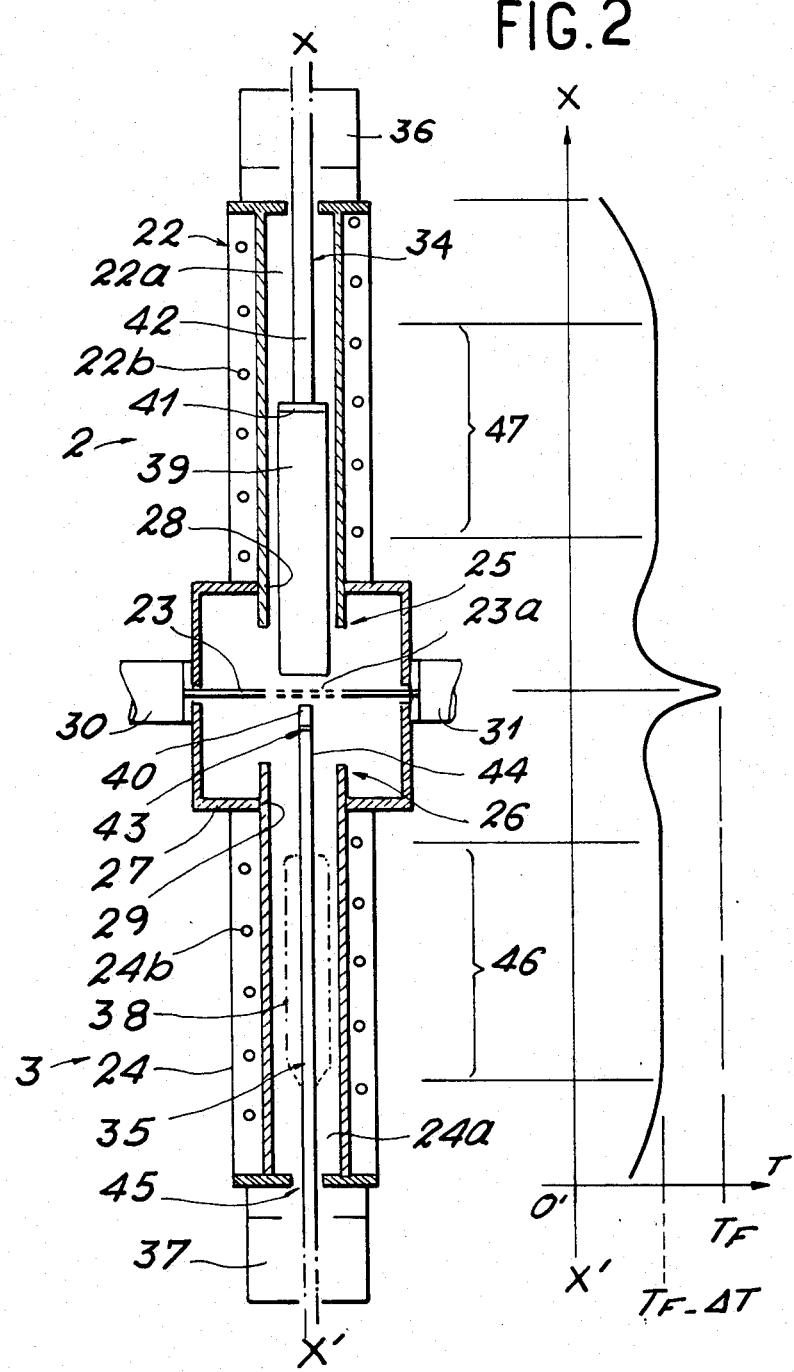

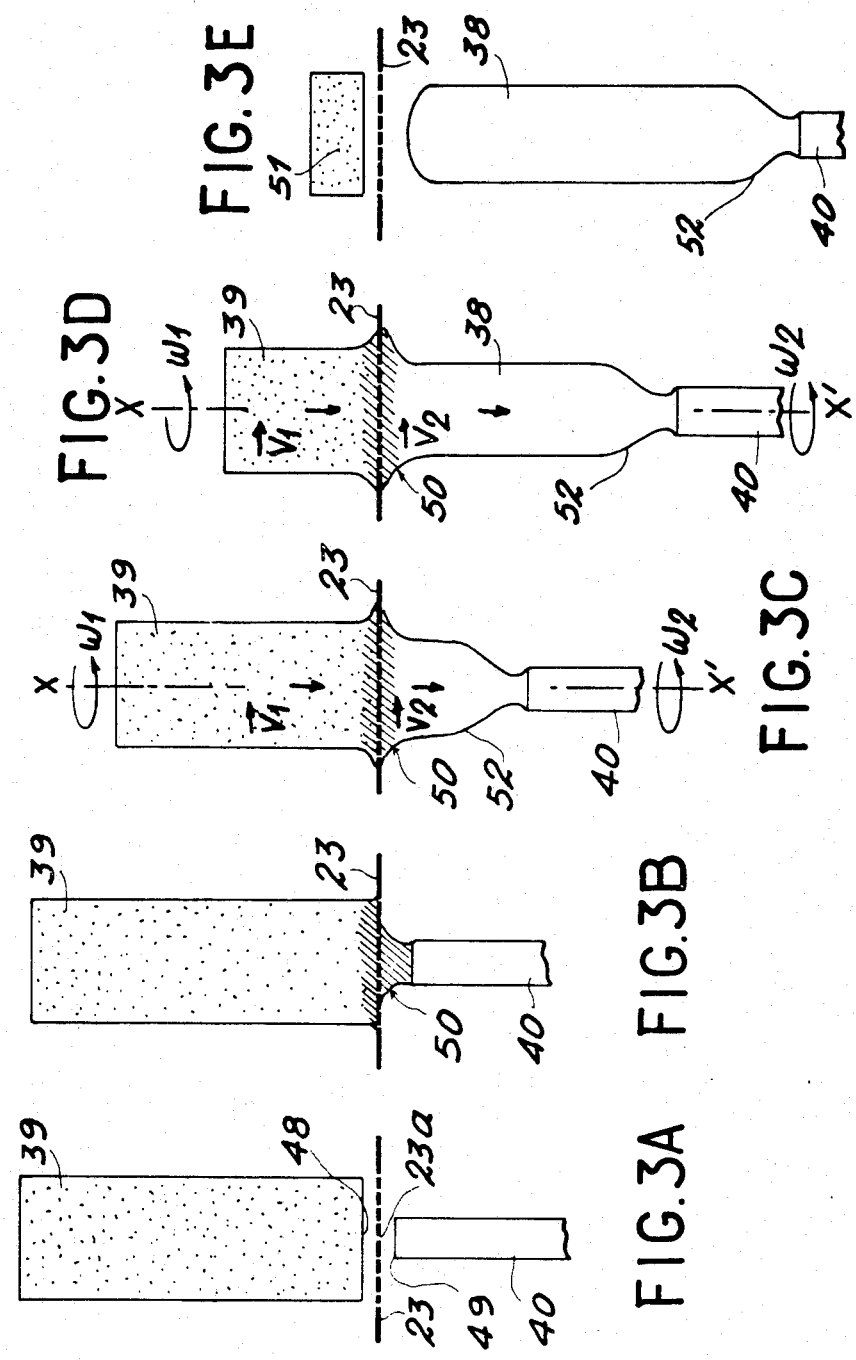

PROCESS FOR PRODUCING A STRAIN-FREE MONOCRYSTAL OF A CRYSTALLINE FERROELECTRIC COMPOUND

The present invention relates to a process and to an apparatus for producing a strain-free monocrystal of a ferroelectric compound having a crystalline structure. It more particularly applies to the production of lithium niobate ($LiNbO_3$) strain-free monocrystals, used e.g. in the production of surface wave filters, modulators and optical amplifiers.

The known processes and apparatus for producing monocrystals of crystalline ferroelectric compounds have the disadvantage of producing, in the case of certain ferroelectric compounds and particularly lithium niobate, monocrystals having internal strains which produce fractures and the probability of fracture formation increases with the length of the monocrystal.

SUMMARY OF THE INVENTION

The present invention relates to a process and to an apparatus for producing a monocrystal of a crystalline ferroelectric compound, which do not suffer from this disadvantage and which make it possible to obtain completely strain-free monocrystals, no matter what their size, particularly unfractured monocrystals with a length of approximately 250 to 300 mm.

More specifically, the present invention relates to a process for the production of a strain-free monocrystal of a ferroelectric compound having a crystalline structure, wherein it comprises producing a monocrystal of the ferroelectric compound, annealing this monocrystal immediately following the production thereof, said annealing being performed in a zero temperature gradient, at a temperature corresponding to the plastic range of the ferroelectric compound and below the melting temperature thereof, followed by a cooling of the monocrystal, constantly maintained in a longitudinal zero temperature gradient.

Cooling takes place in a zero longitudinal temperature gradient and in the lowest possible radial temperature gradient.

Moreover, it is known that ferroelectric compounds permit a transition temperature, called the Curie point, and designated $T_C$, below which they are effectively ferroelectric and above which they become paraelectric.

In the case of lithium niobate, the annealing of the lithium niobate monocrystal takes place at an annealing temperature $T_R$ between the Curie point $T_C$, determined for the ferroelectric monocrystal in question, and the melting point $T_F$ of the monocrystal.

A completely strain-free monocrystal is mainly obtained as a result of the fact that the annealing thereof takes place in a zero temperature gradient and that the monocrystal is cooled in a zero longitudinal temperature gradient.

The cooling in a zero longitudinal temperature gradient is obviously carried out until the monocrystal reaches ambient temperature.

The production, annealing and cooling of the monocrystal can be carried out in air or in a rare gas atmosphere at atmospheric pressure.

According to a special feature of the process according to the invention, the monocrystal is annealed in a homogeneous temperature zone located in the extension of the means provided for producing the monocrystal, in such a way that the latter can pass directly, in a minimum of time, from the means used for its production to the homogeneous temperature zone. The passage from one zone to the other takes place, for example by translation.

According to a special embodiment of the process according to the invention, the monocrystal is produced by the CZOHRALSKI method, i.e. by pulling from a molten bath of this ferroelectric compound, followed by raising in a homogeneous temperature zone equal to the annealing temperature, where it undergoes the annealing and then cooling, said zone being located vertically of the bath. The monocrystal performs a rotary movement during its production, the rotation and pulling being carried out in the same vertical axis.

Moreover, prior to annealing, the homogeneous temperature zone can be progressively raised to the annealing temperature during the production of the monocrystal.

According to another special embodiment of the process according to the invention, the monocrystal is produced by the so-called flat resistor method, i.e. it is produced by placing one end of a bar of the ferroelectric compound and one end of a monocrystalline nucleus of said ferroelectric compound in the vicinity of and on either side of a perforated, flat electrical resistor, maintained at a temperature at least equal to the melting point of the ferroelectric compound, in such a way as to connect the bar and the nucleus by a molten area of the ferroelectric compound, whilst moving said molten area along the bar from the end of the latter and by moving the bar towards the resistor, the nucleus being simultaneously removed from the resistor and the thus produced monocrystal undergoing the annealing and cooling in a homogeneous temperature zone located in the extension of the resistor and on the same side of the latter as the nucleus.

According to a main feature of the invention in said other embodiment, the bar and the nucleus are displaced in the same vertical axis during the production of the monocrystal and the resistor is perpendicular to this vertical axis.

According to another important feature, the bar and the nucleus also perform a rotary movement, whose axis is the same vertical axis, during the production of the monocrystal.

According to another important feature, during the production of the monocrystal, the bar and the monocrystal which is being produced are maintained at a temperature below the melting point of the ferroelectric compound and close to said melting point.

According to another special feature of the process according to the invention, the ferroelectric compound is lithium niobate and the monocrystal is annealed at a temperature above its Curie point, i.e. approximately 1150° C., and below the melting point of lithium niobate. For example, the annealing can then be performed at a temperature at least equal to 1200° C. and below 1250° C.

The present invention also relates to an apparatus for producing a strain-free monocrystal of a crystalline ferroelectric compound, wherein it comprises means for producing a monocrystal of the ferroelectric compound and heating means having a homogeneous temperature zone positioned in the extension of the production means, said heating means being provided on the one hand for annealing the monocrystal immediately following the production thereof, in a zero temperature gradient and at a temperature corresponding to the plastic range of the ferroelectric compound and below the melting point of the ferroelectric compound and, on the other hand for cooling the said monocrystal in a zero longitudinal temperature gradient following the annealing.

According to another special feature of the apparatus according to the invention, the means for producing the monocrystal comprise a first vertical furnace equipped with a crucible for melting therein the ferroelectric compound, the heating means comprise a second vertical furnace having a homogeneous temperature zone, placed above the first furnace and communicating therewith, said furnaces and said crucible also being disposed along the same vertical axis, whilst in the interior of the furnaces is provided a means for bringing about a displacement along the vertical axis and which serves to produce the monocrystal by pulling from the ferroelectric compound, once the latter has melted in the crucible, and for raising the formed monocrystal into the homogeneous temperature zone, so that it undergoes the annealing process there, following cooling.

According to another special embodiment of the invention, the means for producing the monocrystal comprise a first vertical furnace and a perforated, horizontal, flat electrical resistor, which is raised to a temperature at least equal to the melting point of the ferroelectric compound, the heating means comprise a second vertical furnace having a homogeneous temperature zone, said furnaces issuing into one another, the electrical resistor being interposed between them, whereby the furnaces are disposed in accordance with the same vertical axis and are respectively provided in their interiors with a first means and a second means for bringing about movement along the vertical axis, the first means serving to displace a bar of the ferroelectric compound in the direction of the resistor and the second means serving to move a monocrystalline nucleus of the ferroelectric compound away from the resistor, starting from a position in which the bar and the nucleus, located on either side of the resistor, each have an end in the vicinity of the resistor so as to connect, by means of said resistor, bar and nucleus by a molten area of the ferroelectric compound and move said molten area along bar in order to produce the monocrystal and bring the latter into the homogeneous temperature zone of the second furnace, so that it undergoes the annealing process there, followed by cooling.

The various embodiments of the invention described use a single production means associated with a single heating means. It would also be possible to envisage a single production means associated with a plurality of heating means, e.g. arranged in the form of a ring. Following the production of the monocrystal and the placing thereof in heating means, the ring of heating means can then be turned in order to bring another heating means into the axis of the production means.

BRIEF DESCRIPTION OF THE DRAWINGS

The invention is described in greater detail hereinafter relative to non-limitative embodiments and the attached drawings, wherein:

FIG. 2 shows a diagrammatic view of another special embodiment of the apparatus according to the invention;

FIGS. 3a to 3e show diagrammatic views of the different stages of the production of a monocrystal by the so-called flat resistor method in the other special embodiment.

DETAILED DESCRIPTION OF THE INVENTION

Figure 1:
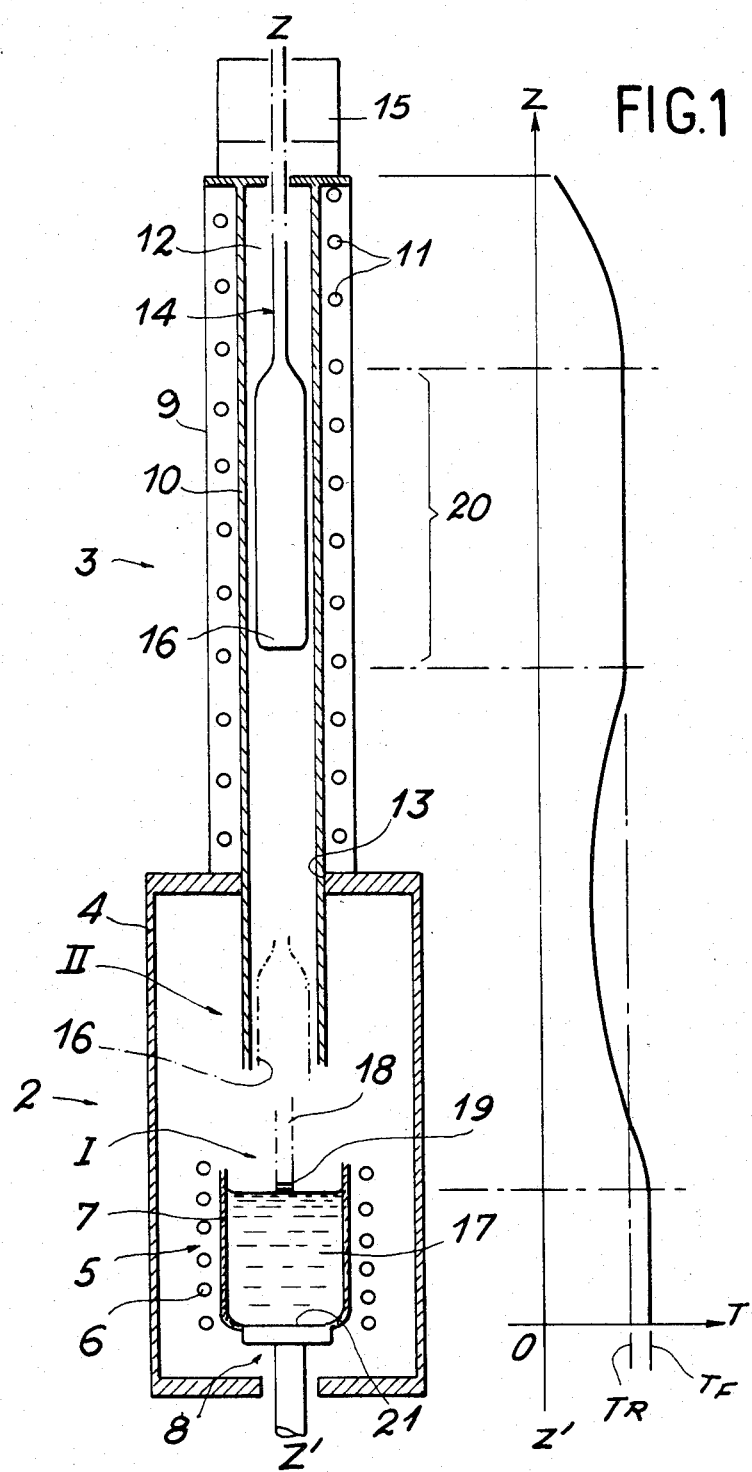
FIG. 1 shows a diagrammatic view of a special embodiment of the apparatus according to the invention.

For example, the ferroelectric compound considered hereinafter is lithium niobate.

FIG. 1 diagrammatically shows a special embodiment of the apparatus according to the invention, which makes it possible to produce completely strain-free lithium niobate monocrystals. It comprises means 2 for producing a lithium niobate monocrystal and heating means 3. The production means 2 essentially comprise, in an enclosure 4, a vertical furnace 5, which can be called the first furnace and whose electrically conductive windings 6 are shown in FIG. 1. A lithium niobate-filled crucible 7 is placed in furnace 5. This crucible is held in place by a support 8. The heating means essentially comprise another vertical furnace 9, which is called the second furnace and which, in per se known manner, comprises a tube 10 formed e.g. from a refractory oxide (alumina, zirconium dioxide) and which is surrounded by electrically conductive windings 11. Furnace 5, crucible 7 and the second furnace 9 are placed along the same vertical axis Z′Z. Moreover, the second furnace 9 is linked with enclosure 2 by means of an opening 13 of axis Z′Z formed in the enclosure. The interiors 12 of furnace 5 and furnace 9 are provided with a displacement means constituted by a rod 14 of axis Z′Z, which is able to rise or fall along axis Z′Z and rotate on itself, whilst rising or falling. This rod 14 is controlled by a per se known translation-rotation system 15 and positioned above the second furnace 9.

The process according to the invention performed in the aforementioned apparatus will now be explained. Initially, a substantially cylindrical lithium niobate monocrystal 16 is produced by the CZOHRALSKI method. For this purpose, the lithium niobate contained in crucible 7 is raised, by means of furnace 5, to its melting point $T_F$ equal to 1250° C., so as to form a molten bath 17. rod 14 is provided at its end 18 facing crucible 7 with a monocrystalline lithium niobate nucleus 19, which is oriented along a given crystallographic direction, made parallel to axis Z′Z. Rod 14 is then lowered in such a way that nucleus 19 is in contact with the molten lithium niobate bath 17 contained in crucible 7 (phase I of FIG. 1) and is then slowly raised, whilst performing a rotary movement on itself. The monocrystal 16 is thus progressively formed at the end of rod 14 (represented by an intermediate phase II in FIG. 1) until it is completely produced.

As soon as it has been produced, the monocrystal 16 is then raised into a homogeneous temperature zone 20, or homogeneous heating zone, in which is provided the second furnace 9 and undergoes there annealing at a temperature $T_R$, so that $$1200° C. \leq T_R < 1250° C.$$

The homogeneous heating zone 20 is progressively raised to the annealing temperature $T_R$ during the production of monocrystal 16.

Thus, all parts of the monocrystal 16 located in zone 20 are at the same temperature $T_R$. This is shown in FIG. 1 by means of a graph representing the temperature variations within the apparatus according to the invention, as a function of the altitude in question, countered on the upwardly oriented axis Z'Z and provided with an origin O corresponding to the bottom 21 of crucible 7. The temperature maintains a constant value $T_F$ in the crucible, then drops, and then rises up to temperature $T_R$ in the vicinity of the homogeneous heating zone 20, in which it is constant and equal to temperature $T_R$. Thus, in said zone is established a zero temperature gradient dT/dZ. Finally, the temperature drops above said zone 20. The annealing time is a function of the monocrystal diameter.

When the annealing of the monocrystal 16 is completed, the temperature of the homogeneous heating zone 20 is slowly and uniformly lowered to ambient temperature (approximately 20° C., so that monocrystal 16 is cooled in a temperature gradient, which remains zero in the longitudinal direction throughout the cooling time of the monocrystal.

It has been stated hereinbefore that the zero temperature gradient condition during annealing and cooling is essential for obtaining a strain-free monocrystal. Thus, it is the length of the homogeneous heating zone 20, which determines the length of the finally obtained, completely strain-free monocrystal. It is consequently sufficient to use another furnace 9, or post-heating furnace, having a homogeneous heating zone 20 having a length at least equal to that of the monocrystal 16 to ensure that the latter is completely strain-free, when produced by the aforementioned process.

As a non-limitative example, the following experimental conditions can be used for producing a strain-free lithium niobate monocrystal with the apparatus of FIG. 1.

Operation 1: Melting of a 2.8 kg lithium niobate charge in a platinum crucible 7, of diameter 110 mm and height 110 mm, placed in a resistive furnace 5.

Operation 2: Simultaneous with operation 1, raising of the temperature of the post-heating furnace 9.

Operation 3: Pulling, at the crystallization speed of 5 mm/hour and at a rotation speed along axis Z'Z of approximately 12 r.p.m., of a lithium niobate monocrystal in the crystallographic direction Z. Nucleus 19 is oriented in such a way that its crystallographic directions <001> are parallel to the vertical axis Z'Z. The monocrystal obtained weighs approximately 2 kg, has a diameter between 48 and 50 mm and a length of approximately 230 mm.

Operation 4: During pulling, raising the temperature of the post-heating furnace 9 at a rate of 30° C./hour, until the homogeneous heating zone 20 is at a temperature $T_R$ equal to 1215°±5° C.

Operation 5: When pulling is at an end, raising of the monocrystal, at a speed of 30 mm/hour, into the homogeneous temperature zone 20 of the post-heating furnace 9, the length of the homogeneous zone being approximately 250 mm.

Operation 6: Annealing of the monocrystal for 12 hours at temperature $T_R$.

Operation 7: Lowering the temperature of the post-heating furnace 9, at a rate of 30° C./hour, untilthe homogeneous heating zone 20 is at ambient temperature.

For example, enclosure 4 is an open enclosure and this also applies with respect to the post-heating furnace, in such a way that all the aforementioned operations are carried out under air at atmospheric pressure.

Once again, in a non-limitative manner, the following experimental conditions can be used for producing a completely strain-free lithium niobate monocrystal using the apparatus of FIG. 1:

Operation 1: Melting a 4 kg lithium niobate charge in a platinum crucible 7, of diameter 120 mm and height 120 mm, placed in a high frequency furnace 5.

Operation 2: Simultaneously with operation 1, raising the temperature of the post-heating furnace 9.

Operation 3: Pulling at the crystallization speed of 5 mm/hour and at a rotary speed along axis Z'Z of approximately 15 r.p.m. of a lithium niobate monocrystal in the crystallographic direction y. Nucleus 19 is oriented in such a way that its crystallographic directions <010> are parallel to the vertical axis Z'Z. The monocrystal obtained has a weight of approximately 2.75 kg, a diameter between 52 and 56 mm and a length of approximately 200 mm.

Operation 4: When pulling is at an end, the monocrystal is raised at a speed of 30 mm/hour into the homogeneous temperature zone 20 of the post-heating furnace 9, the temperature $T_R$ of said zone being 1215°±5° C.

Operation 5: Annealing the monocrystal for 12 hours at temperature $T_R$.

Operation 6: Lowering the temperature of the post-heating furnace 9 at a rate of 30° C./hour until the homogeneous heating zone 20 is at ambient temperature.

Enclosure 4 is, for example, an open enclosure, which also applies with respect to the post-heating furnace, so that all the aforementioned operations are performed under air and at atmospheric pressure.

FIG. 2 diagrammatically shows another special embodiment of the apparatus according to the invention making it possible to produce completely strain-free lithium niobate monocrystals. It comprises means 2 for producing a lithium niobate monocrystal and heating means 3. The production means 2 essentially comprise a vertical furnace 22, or preheating furnace and which can be called the first furnace, as well as a horizontal, flat metal electrical resistor 23, perforated with holes 23a. The heating means 3 essentially comprise another vertical furnace 24, or post-heating furnace, which is also called the second furnace. Furnaces 22 and 24 are arranged along the same vertical axis X'X and are made from a refractory oxide (alumina, zirconium oxide) and are surrounded by heating resistors 22b and 24b. They open out onto one another and the flat electrical resistor 23 is placed between them. For this purpose, furnace 22 and furnace 24 are respectively provided with facing open ends 25, 26. These ends penetrate an enclosure 27 by means of openings 28, 29 of axis X'X made therein. Resistor 23 is held horizontally in said enclosure between ends 25 and 26, with the aid of current lead-ins 30 and 31 thereto.

Furnace 22 is, for example, positioned above the other furnace 24. Furnaces 22 and 24 are respectively provided in their interiors 22a, 24a, with first and second displacement means, respectively constituted by a first rod 34 of axis X'X and a second rod 35, also of axis X'X. The first and second rods can be raised or lowered along axis X'X and can rotate on themselves, whilst still rising or falling. They are respectively controlled by first and second per se known translation-rotation sytems 36, 37 respectively. The first system, or upper mechanism, is positioned above the furnace 22 and the second system, or lower mechanism, is placed below the other furnace 24.

The process according to the invention, performed in the apparatus of FIG. 2 described hereinbefore, will now be described. Initially, a substantially cylindrical lithium niobate monocrystal 38 is produced by the flat resistor method. For this purpose, a cylindrical bar 39 is used, which is formed from lithium niobate powder, compacted by isostatic pressing and a nucleus 40 formed from a monocrystalline lithium niobate cylindrical bar of small size and whose axis is oriented in the desired crystallographic direction. Bar 39 is vertically fixed to a support 41, provided at the end 42 of the first rod 34, said end facing resistor 23. Nucleus 40 is vertically fixed to a support 43, provided at the end 44 of the second rod 35 and which faces resistor 23.

The electrical resistor is maintained at the melting point $T_F$ of the lithium niobate and which is equal to 1250° C. The equilibrium temperature of furnaces 22 and 24 is maintained equal to a temperature $T_F - \Delta T$, which is very close to the melting point $T_F$, $\Delta T$ being e.g. approximately 30° C. This is shown on FIG. 2, which also shows the variations of temperature T within the apparatus according to FIG. 2, as a function of the considered altitude, countered on axis X'X oriented upwards and having an origin O' corresponding to the bottom 45 of the second furnace 24. The latter is provided with a homogeneous temperature zone 46 having a length at least equal to that of the monocrystal to be formed. It is possible to choose a furnace 22 identical to the second furnace 24 and consequently also provided with a homogeneous temperature zone 47. Temperature T then increases from bottom 45 to the homogeneous temperature zone 46 of the other furnace 24, in which it remains constant and equal to $T_F - \Delta T$, followed by a fall and then rises up to $T_F$ at resistor 23, drops again below the value $T_F - \Delta T$, rises up to said value and maintains this in the homogeneous temperature zone 47 of furnace 22 and then drops again.

The production of the lithium niobate monocrystal 38 will be better understood with the aid of FIGS. 3a to 3e. Bar 39 and nucleus 40 are firstly displaced respectively in furnace 22 and in second furnace 24, with the aid of top and bottom mechanisms 36, 37, in such a way that their respective ends 48, 49 are in contact with the perforated resistor 23 (FIG. 3a). As the latter is at melting point $T_F$, between bar 39 and nucleus 40, a molten area 50 forms, linking the bar and the nucleus (FIG. 3b). By means of the top and bottom mechanisms, the bar is then progressively lowered, i.e. advanced towards the perforated resistor 23, whilst effecting a rotary movement of axis X'X and simultaneously nucleus 40 is also progressively lowered, i.e. moved away from the resistor, whilst also performing a rotary movement of axis X'X in such a way that the molten area 50 moves along bar 39 (FIGS. 3c and 3d). Thus, the lithium niobate is melted at the level of resistor 23, then cooled and recrystallized in accordance with the orientation of the nucleus 40, on the same side of the latter with respect to the resistor 23. When only a small portion 51 of bar 39 is left, the lowering thereof and of the nucleus is stopped and the production of the monocrystal is then completed (FIG. 3e).

The thus produced monocrystal is positioned in the homogeneous temperature zone 46 of the other furnace 24, where it undergoes annealing under a zero temperature gradient. For this purpose, this zone is previously raised to a temperature $T_R$ of approximately 1200° C. for carrying out the annealing process. The temperature of zone 24 is then progressively lowered to ambient temperature so as to cool the monocrystal, still under a zero longitudinal temperature gradient.

According to a special embodiment of the flat electrical resistor, the latter is constituted by a platinum sheet having calibrated holes and constantly kept flat and horizontal by known progressive tension means, as a function of its temperature and therefore its malleability. The equilibrium temperature in the central part of the resistor is kept equal to the melting point $T_F$, i.e. 1250° C. The holes in the resistor permit the passage of the lithium niobate in liquid form from the upper part to the lower part of the apparatus of FIG. 2, (defined with respect to the resistor) and are distributed in the central part of the platinum sheet in order to form there a homogeneous zone having a high electrical resistance and consequently where the maximum heat quantity is given off. Preferably, the holes in this homogeneous zone have a symmetrical distribution with respect to the vertical axis X'X.

This flat resistor method offers a very great advantage compared with all other zone melting methods. The direct coupling of the resistor and the material to be melted ensures that heat losses are of a minimum nature. The positive latent heat of crystallization given off beneath the resistor is immediately and almost integrally recovered above the resistor in the form of negative melting latent heat. The thermal efficiency is consequently of a maximum nature. In this case, the crystallization speeds can be very high (5 to 10 times higher than with other zone melting methods).

For example, the following experimental conditions can be used for producing a lithium niobate monocrystal with the apparatus of FIG. 2. Use is made of a LiNbO$_3$ powder (of the type marketed by Johnson-Matthey) screened to 1 00 μm, vibrated and pressed (by isostatic pressing at 2 kbar), so as to obtain a compact bar 39 of diameter 25 mm and length 150 mm. The monocrystalline nucleus 40 is oriented in crystallographic direction z or y. Therefore, $V_1$ and $\omega_1$ are the translation and axial rotation speeds of the bar in accordance with axis X'X. In the same way, $V_2$ and $\omega_1$ are the translation and axial rotation speeds of the nucleus along axis X'X. At the start of crystallization, i.e. during the formation of the top 52 of monocrystal 38 (FIG. 3c), we choose:

$\omega_1 = 12$ r.p.m. and $V_1 = 2$ mm/hour
$\omega_2 = 20$ r.p.m. and $V_2 = 18$ mm/hour.

During the actual crystallization (FIG. 3d) in order to obtain a diameter 20 mm monocrystal, the following conditions are chosen:

$\omega_1 = 12$ r.p.m. and $V_1 = 15$ mm/hour
$\omega_2 = 20$ rp.m. and $V_2 = 18$ mm/hour At the end of pulling (FIG. 3e) the remaining part 51 of bar 39 is raised. The monocrystal 38 is left in contact with resistor 23 for 30 minutes and then is slowly separated therefrom to be brought into the homogeneous temperature zones 46 of the post-heating furnace 24 heated to 1200° C., in order to undergo the annealing process therein under a zero temperature gradient for 12 hours. Cooling is then performed under a zero longitudinal temperature gradient until ambient temperature is reached and at a cooling rate of 30° C./hour.

Obviously, due to the symmetry of the apparatus shown in FIG. 2, it would be possible to reverse the functions of furnaces 22 and 24, bar 39 and nucleus 40 then being respectively mounted on second rod 35 and first rod 34, whilst being moved towards the top of the apparatus during the production of the monocrystal.

Obviously, it is also possible to use methods other than the CZOCHRALSKI and flat resistor methods for producing the LiNbO$_3$ monocrystal, e.g. the zone melting point, BRIDGMANN, VERNEUIL and KYROPOULOS methods. Nevertheless, the CZOCHRALSKI and flat resistor methods are particularly suitable for the process according to the invention.

What is claimed is:

1. A process for the production of a strain-free monocrystal of a ferroelectric compound having a crystalline structure, wherein it comprises producing a monocrystal of the ferroelectric compound, annealing this monocrystal immediately following the production thereof, said annealing being performed in a zero temperature gradient, at a tmperature corresponding to the plastic range of the ferroelectric compound and below the melting temperature thereof, followed by a cooling of the monocrystal, constantly maintained in a longitudinal zero temperature gradient.

2. A process according to claim 1, wherein the monocrystal is annealed in a homogeneous temperature zone located in the extension of the means provided for producing the monocrystal, in such a way that the latter can pass directly from the means provided for producing the same to the homogeneous temperature zone.

3. A process according to claim 2, wherein the monocrystal of the ferroelectric compound is produced by pulling, from a molten bath of the said ferroelectric compound and is then raised into a homogeneous temperature zone equal to the annealing temperature, where it undergoes the annealing process followed by cooling, said zone being positioned vertically of the bath.

4. A process according to claim 3, wherein the monocrystal performs a rotary movement during its production, the rotation and pulling taking place in accordance with the same vertical axis.

5. A process according to claim 3, wherein the homogeneous temperature is, prior to annealing, progressively raised to the annealing temperature, during the production of the monocrystal.

6. A process according to claim 2, wherein the monocrystal of the ferroelectric compound is produced by placing one end of a bar of said ferroelectric compound and one end of a monocrystalline nucleus of the ferroelectric compound in the vicinity of and on either side of a perforated, flat electrical resistor, kept at a temperature at least equal to the melting point of the ferroelectric compound, in such a way as to interconnect the bar and the nucleus by a molten area of the ferroelectric compound, and by displacing the molten area along the bar, from the said ends thereof, by the displacement of the bar towards the resistor, the nucleus being simultaneously removed from the resistor, and wherein the thus produced monocrystal undergoes annealing and then cooling in a homogeneous temperature zone located in the extension of the resistor and on the same side thereof as the nucleus.

7. A process according to claim 6, wherein the bar and the nucleus are displaced along the same vertical axis during the production of the monocrystal, and wherein the resistor is perpendicular to the vertical axis.

8. A process according to claim 7, wherein the bar and the nucleus also perform a rotary movement whose axis is the same vertical axis, during the production of the monocrystal.

9. A process according to claim 6, wherein, during the production of the monocrystal, the bar and the monocrystal being produced are maintained at a temperature below the melting point of the ferroelectric compound and close to said melting point.

10. A process according to claim 1, wherein the ferroelectric compound is lithium niobate and wherein the annealing of the monocrystal takes place at a temperature above the Curie point, i.e. approximately 1150° C., and below the melting point of the lithium niobate.

11. A process according to claim 10, wherein the ferroelectric compound is lithium niobate and annealing is carried out at a temperature at least equal to 1200° C. and below 1250° C.

* * * * *